(12) United States Patent
Nys (10) Patent No.: US 7,561,086 B2
(45) Date of Patent: Jul. 14, 2009

(54) ELECTRONIC CIRCUIT FOR THE ANALOG-TO-DIGITAL CONVERSION OF AN ANALOG INPUT SIGNAL

(75) Inventor: Olivier Nys, Neuchatel (CH)

(73) Assignee: Semtech Neuchatel SA, Neuchatel (CH)

( * ) Notice: Subject to any disclaimer, the term of this patent is extended or adjusted under 35 U.S.C. 154(b) by 0 days.

(21) Appl. No.: 11/848,869

(22) Filed: Aug. 31, 2007

(65) Prior Publication Data

US 2008/0094270 A1   Apr. 24, 2008

Related U.S. Application Data

(63) Continuation of application No. PCT/EP2005/051676, filed on Apr. 15, 2005.

(51) Int. Cl.
*H03M 3/00* (2006.01)

(52) U.S. Cl. .................. 341/143; 341/118; 341/120; 341/155; 341/172

(58) Field of Classification Search ................. 341/118, 341/120, 143, 155, 172
See application file for complete search history.

(56) References Cited

U.S. PATENT DOCUMENTS

| | | | | |
|---|---|---|---|---|
| 5,227,795 | A * | 7/1993 | Yamakido et al. | 341/166 |
| 6,340,945 | B1 * | 1/2002 | Hauptmann et al. | 341/172 |
| 6,473,018 | B2 * | 10/2002 | Ueno et al. | 341/143 |
| 6,507,301 | B2 | 1/2003 | Locher | |
| 6,674,381 | B1 * | 1/2004 | Gomez et al. | 341/143 |
| 6,962,436 | B1 * | 11/2005 | Holloway et al. | 374/170 |
| 7,075,475 | B1 * | 7/2006 | Wan | 341/172 |
| 7,230,555 | B2 * | 6/2007 | Dolazza et al. | 341/143 |
| 7,242,336 | B1 * | 7/2007 | Jensen | 341/143 |
| 7,355,539 | B2 * | 4/2008 | Petersen et al. | 341/143 |
| 7,372,392 | B1 * | 5/2008 | Wan et al. | 341/172 |
| 7,385,547 | B2 * | 6/2008 | Boemler | 341/163 |
| 7,423,568 | B2 * | 9/2008 | Hellwig et al. | 341/143 |
| 2001/0033240 | A1 * | 10/2001 | Ueno et al. | 341/143 |
| 2005/0052299 | A1 * | 3/2005 | Oliaei | 341/143 |

FOREIGN PATENT DOCUMENTS

EP   1 317 068 A1   8/2001

* cited by examiner

*Primary Examiner*—Linh V Nguyen
(74) *Attorney, Agent, or Firm*—Blank Rome LLP (57) ABSTRACT

Electronic circuit for the analog-to-digital conversion of the alternative current (AC) component of an analog input signal. The electronic circuit has a coupling device with an input and an output coupling device delivers at its output an analog AC signal when the analog input signal is applied to the input. An analog-to-digital converter converts the analog AC signal into a digital output signal. A feedback loop has a digital-to-analog converter for converting the digital output into an analog feedback signal, the feedback loop being coupled to the coupling device, and the feedback loop has a first feedback path comprising a switched capacitor.

17 Claims, 5 Drawing Sheets

ELECTRONIC CIRCUIT FOR THE ANALOG-TO-DIGITAL CONVERSION OF AN ANALOG INPUT SIGNAL

REFERENCE DATA

This application is a continuation of international patent application PCT/EP2005/051676, filed on Apr. 15, 2005, incorporated herewith by reference.

FIELD OF THE INVENTION

The present invention relates to an electronic circuit for the analog-to-digital conversion of an analog input signal. The present invention relates in particular to an electronic circuit for the analog-to-digital conversion of the AC component of an analog input signal, which is adapted for a realization as integrated circuit.

DESCRIPTION OF RELATED ART

In various applications, the useful signal of a given analog input signal is only its AC component, which is superposed to an unknown direct current (DC) level that is of no interest. This is for example the case in audio or infrared applications. In some cases, the DC level can be much higher in amplitude than the useful AC signal. If the analog signal needs to be converted into a digital signal, the DC level is preferably removed before performing the analog-to-digital conversion, otherwise the required dynamic range of the analog-to-digital converter could be drastically increased.

Figure 1:
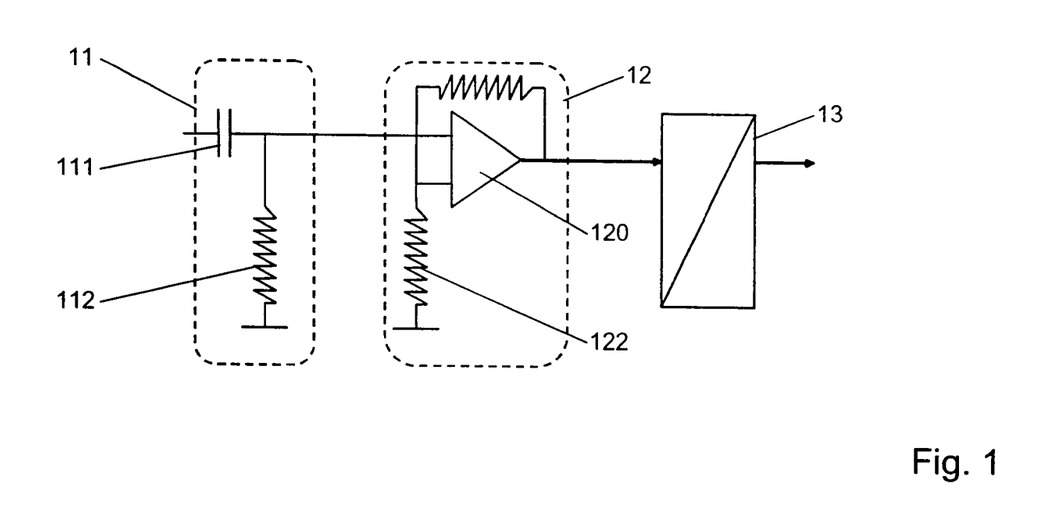
FIG. 1 is a schematic representation of a prior art electronic circuit for the analog-to-digital conversion of the AC component of an analog input signal, already discussed
Figure 2:
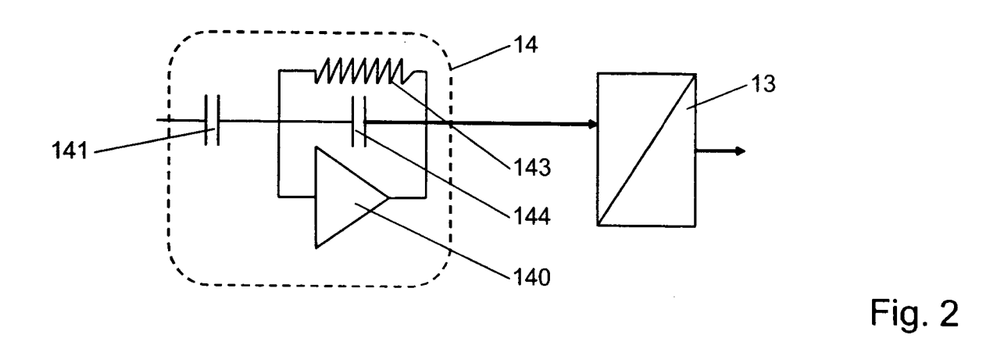
FIG. 2 is a schematic representation of another prior art electronic circuit for the analog-to-digital conversion of the AC component of an analog input signal, already discussed

FIG. 1 illustrates the schematics of an usual prior art electronic circuit for performing such an analog-to-digital conversion. The electronic circuit consists into a high pass filter 11 cascaded with an optional preamplifier 12 and an analog-to-digital converter 13. A variant prior art solution is represented in FIG. 2, wherein the high pass filter and the preamplifier are combined into a preamplifier 14 with high pass characteristics.

Some applications, such as conversion of audio signals and infrared detection for example, further have a relatively low bandwidth which is typically of around 10 kHz. The analog-to-digital converter is then preferably oversampled, i.e. clocked at a much higher sampling frequency than the Nyquist rate, so that resolution can be increased by averaging the digital output of the circuit. Typical conversion circuits for these applications are for example sigma delta converters.

A problem of the prior art solutions, in particular for the applications mentioned above, is the realization of the high pass filter. Indeed, as the useful analog AC signal lies in a relatively low frequency domain, the cutoff frequency of the high pass filter 11, 14 must be very low. The cutoff frequency must typically be of the order of 100 Hz or lower for audio signals, and below 1 Hz for infrared signals. As the cutoff frequency fc of the high pass filter 11 of FIG. 1, for example, is given by $$fc = \frac{1}{(2 \cdot \pi \cdot R \cdot C)},$$

where R is the resistance value of resistor 112 and C is the capacitance value of capacitor 111, this implies extremely large capacitance and/or resistance values for capacitor 111 and resistor 112 respectively, and thus large silicon area when the conversion circuit is realized in the form of an integrated circuit. For instance, in order to obtain a cutoff frequency of 100 Hz with a capacitor of 10 pF, a resistor of 159 megohms would be required, which is not a realistic resistance value for classical resistors available on integrated circuits which are typically high resistive polysilicon resistors and are of the order of 10 megohms at the maximum.

In the electronic circuit of FIG. 1, the cutoff frequency fc of the highpass filter 11 is defined by the resistor 112 and the capacitor 111. The problem is however even more acute in the electronic circuit of FIG. 2, where the cut-off frequency of the preamplifier 14 is defined according to the above formula by resistor 143 and capacitor 144, and where the capacitance of coupling capacitor 141 is G times higher than the capacitance of capacitor 144, with G being the gain of the preamplifier 14. This implies that, for a given cut-off frequency and a given gain, the coupling capacitor 141 must have a very large capacitance and thus would require a very large area when realized in the form of an integrated circuit.

Another problem in the design of the high pass filter 11, 14 is the thermal noise due to its resistor 112, 143. This thermal noise may be represented either by a noise voltage source in series with the resistor 112, 143 with a noise spectral density of $4 \cdot k \cdot T \cdot R$ in $V^2/Hz$, or by a current noise source in parallel with the resistor, with a noise spectral density of $(4 \cdot k \cdot T)/R$ in $A^2/Hz$, where R is the resistance of resistor 112, 143, k is the Bolzmann constant and T is the absolute temperature. Considering for example the model with the current noise source, the noise current is injected after the input coupling capacitor 111, 141. This noise can be converted into an input referred noise voltage spectral density $Svn^2$ by dividing it by the square of the module of the conductance $j \cdot \omega \cdot CC$ of the input coupling capacitor 111, 141 having capacitance CC, leading to $$Svn^2 = \frac{\frac{4 \cdot k \cdot T}{R}}{|j \cdot \omega \cdot CC|^2} = \frac{4 \cdot k \cdot T}{R \cdot |2 \cdot \pi \cdot f \cdot CC|^2} = \frac{k \cdot T}{R \cdot \pi^2 \cdot f^2 \cdot CC^2}.$$

This noise contribution being proportional to $1/f^2$, it is extremely important in low frequency. As an example, in the case of the electronic conversion circuit of FIG. 1, obtaining a noise spectral density of 10 μmV/sqrt(Hz) at 1 Hz with a coupling capacitor 111 of 10 pF implies a resistor 112 of 40 gigohms.

Hence, for low frequency applications, the dimensioning of the high pass filter 11, 14 is very constraining and requires extremely large resistance and capacitance values for resistors 112, 143 and capacitors 111, 141, 144, respectively. These resistors 112, 143 can generally not be realized with classical resistive layers available on integrated circuits. Even with technologies with high resistive polysilicon available on integrated circuits, the resistance value of resistors can hardly exceed 10 megohms, while the required resistance values according to the electronic circuit design of FIG. 1 and FIG. 2 for low frequency applications often exceed 1 gigohm.

Other types of "non classical" resistors are also available on integrated circuits, but suffer from other drawbacks:

1. Reverse biased diodes, for example, allow the realization of a very high resistive path. However, the conductance of such diodes is extremely non linear by definition, and hence the DC voltage is very poorly controlled. In fact, the voltage is rather floating between limits given by the conductance of the diodes.
2. Another solution is to use a switched capacitor branch as a resistor. A resistive path between two nodes can be obtained by switching a capacitor at a given switching frequency between the two nodes. The equivalent resistance of the resistive path is then equal to $1/(Csw \cdot fsw)$, where Csw is the capacitance of the switched capacitor and fsw is the switching frequency. By selecting a capacitor having a very small capacitance value and a very small switching frequency, a very large equivalent resistance can be obtained. For instance, switching a capacitor with a capacitance of 100 fF at a switching frequency of 1 Hz leads to a resistive path with an equivalent resistance of 10 Teraohms. This solution suffers nevertheless from several drawbacks, among which:

The signals around the multiples of the switching frequency are seen by the switched capacitor branch as a DC or quasi DC signal and hence compensated by a DC or low frequency signal. This is the aliasing effect. The lower the switching frequency, the most acute the aliasing problem will be.

The charge injection and the leakage current add an offset (built-in offset voltage source) within the switched capacitor branch, so that another DC component is reintroduced within the high pass filter, reducing its efficiency. Moreover, the built-in offset voltage is given by $\Delta Qinj/Csw$, where $\Delta Qinj$ is the charge injection due to the switching of the capacitor and Csw is the capacitance value of the switched capacitor. Thus the lower the capacitance value of the switched capacitor, the higher the offset will be.

Hence, whichever prior art method is used for realizing the resistor 111, 143, a drawback is that the output of the high-pass filter 11 or the internal node of the high pass preamplifier 14 is a node with extremely high impedance, and hence very sensitive to parasites, leakage, eventually aliasing.

Figure 3:
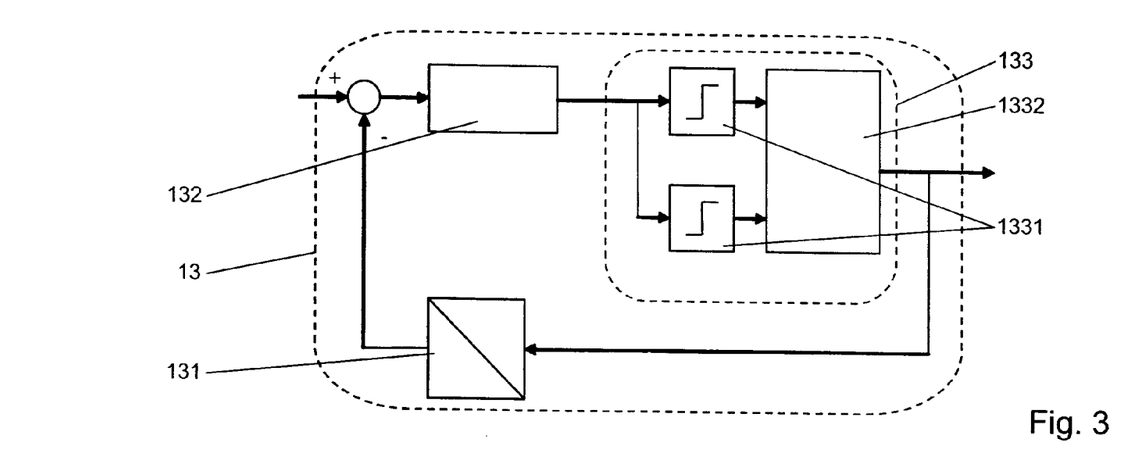
FIG. 3 is a detailed schematic representation of an analog-to-digital converter used for low frequency applications, already discussed

Furthermore, most prior art analog-to-digital converters 13 used in low frequency applications such as for example sigma delta or successive approximation converters include a feedback loop for increasing their accuracy. An example of such an analog-to-digital converter 13 is for example illustrated in FIG. 3. The feedback loop usually comprises a digital-to-analog converter 131 for converting the digital output signal back into an analog feedback signal and comparing it with the analog input signal. The difference between the input signal and the feedback signal is then possibly filtered and/or integrated by an optional filtering and/or integrating circuit 132, then quantified by some decision circuitry 133 made of one or a few comparators 1331 and digital gates 1332 in order to generate the new corrected estimate of the digital output.

A further drawback of prior art electronic circuits for analog-to-digital conversion used for low-frequency applications is thus that the feedback loop from the digital output back to the analog part is limited within the analog-to-digital converter 13.

Going back to FIG. 1 and FIG. 2, as the feedback loop is limited within the analog-to-digital converter 13, the feedback signal is not subtracted to the analog input signal before it reaches converter 13. This means that the entire analog input signal propagates through the blocks 11, 12; 14 before the analog-to-digital converter 13, hence through the high pass filter 11 and through the preamplifier 12, 14. The maximum level of the input signal thus determines a limit to the maximum gain that can be achieved in the preamplifier 12, 14, as the output level of the preamplifier 12, 14 is limited, namely by its power supply. As high gain is therefore only achievable late in the conversion chain, all the noise introduced before that, in particular the thermal noise of the amplifier 120 and the thermal noise of the high pass resistor 112, 143 has a high impact on the resolution of the whole conversion circuit. The linearity of the preamplifier 12, 14 is also important, as the entire analog input signal is passing through it.

One possibility to optimize the dynamic range of the conversion circuit is to select a high gain for the preamplifier 12, 14 when the analog input signal going through it is small, and a lower gain when the analog input signal is large, in order to better exploit the dynamic range of the analog-to-digital converter 13. The gain variation in the preamplifier 12, 14 is then compensated after the analog-to-digital converter 13, thus in the digital output signal, by the inverse operation, i.e. digital division by a number corresponding to the gain of the preamplifier 12, 14, in order to keep the overall gain of the conversion circuit constant. A drawback of this solution, called gain switching, is that the envelope of the input signal can substantially vary in time, as is particularly the case for audio signals, so that a fixed gain can not meet the specification. An issue is then that large spikes, or clicks, appear each time the gain of the preamplifier 12, 14 is changed. These clicks are very difficult to avoid without a lot of additional circuitry which also contributes to increase the complexity of the overall conversion circuit, its area on the integrated circuit, its power consumption and its noise level.

Figure 4:
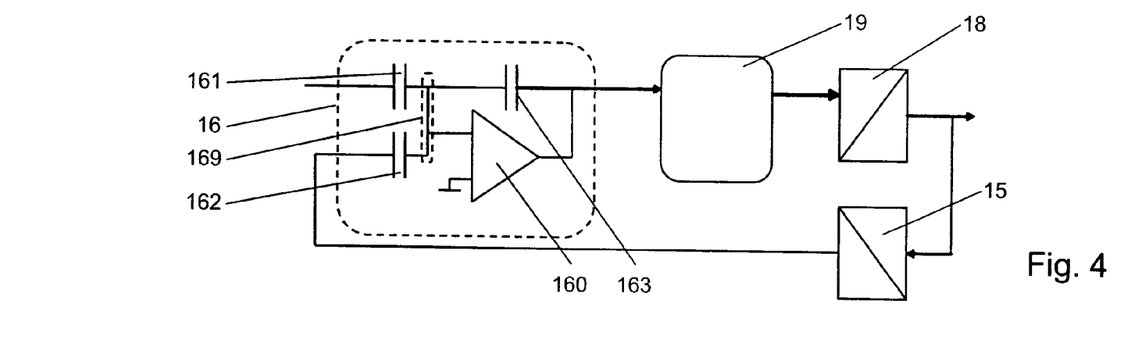
FIG. 4 illustrates another electronic circuit for the analog-to-digital conversion of the AC component of an analog input signal, already discussed

Another solution could be to close the feedback loop as soon as possible in the conversion chain, thus to subtract the analog feedback signal from the analog input signal as close as possible to the input of the conversion circuit. An example of a conversion circuit applying this solution is schematically illustrated in FIG. 4. In this example, the analog feedback signal out of a digital-to-analog converter 15 is subtracted from the input signal within a preamplifier 16.

In a similar way as for the analog input signal which is AC coupled through an input coupling capacitor 161, the analog feedback signal, which is preferably proportional to the digital output of the conversion circuit, is applied through a feedback coupling capacitor 162. The charges injected by the input signal and by the feedback signal are thus combined, after their weighting by the coupling capacitors 161 and 162, in the residue amplifier 160, in order to generate an analog error signal. The error signal is then preferably amplified by an optional analog processing block 19 before being converted into a digital output signal by an analog-to-digital converter 18. Assuming enough gain is provided by the analog processing block 19 in the frequency band of interest, the error signal is maintained by the feedback loop close to a steady state value. If the residue amplifier 160 is working properly, its virtual ground 169 should also remain close to a nominal value corresponding to ground. The electric charge Qvirt on the virtual ground 169 is given by:

$$Qvirt = Cin \cdot Vin - Cdac \cdot Vdac + Cfb \cdot Vamp - (Cin + Cdac + Cfb) \cdot Vvirt,$$

where Cin and Cdac are the capacitance values of the input coupling capacitor and of the feedback coupling capacitor respectively, Vin and Vdac are the voltage values of the input signal and of the feedback signal respectively, Cfb is the capacitance value of the preamplifier capacitor 163, Vamp is the voltage values of the error signal and Vvirt is the voltage value present on the virtual ground 169.

Hence, the voltage value Vdac of the feedback signal, which represents the digital output signal, corresponds to the voltage value Vin of the input signal with a gain Cin/Cdac, plus an offset:

$$V_{dac} = \frac{C_{in} \cdot V_{in} + Q_{offset}}{C_{dac}}$$

with $$Q_{offset} = +C_{fb} \cdot V_{amp} - (C_{in} + C_{dac} + C_{fb}) \cdot V_{virt} - Q_{virt}.$$

In terms of signal processing, this offset on the voltage value Vdac, thus on the digital output signal, is not a problem because it can be removed digitally by digital high pass filtering. The problem is however an electrical problem within the preamplifier 16. The virtual ground 169 in FIG. 4 has no DC path to ground, and is hence floating. This means that the electric charge Qvirt present on the virtual ground 169 is unknown, or at least undefined. In order to maintain the voltage value Vamp of the error signal around its steady state value Vamp0 and to maintain the voltage value Vvirt at the virtual ground 169 around its nominal value Vvirt0 with the voltage value Vin fixed and the charge Qvirt unknown, the voltage value Vdac that would be required for the feedback signal according to the equation given above in order to compensate the offset would most probably fall outside the output range of the digital-to-analog converter 15.

Even if, by chance, it was possible to compensate the offset initially with a voltage value Vdac within the range of the digital-to-analog converter 15, this would not remain possible indefinitely while the conversion circuit is being used due to the leakage currents on virtual ground 169. Indeed, assuming that the voltage value Vin remains at a fixed level, maintaining the voltage Vamp of the error signal around its steady state value Vamp0 and the voltage value Vvirt around its nominal value Vvirt0 with a leakage current ileak on virtual ground 169 would require to apply a current $$C_{dac} \frac{dV_{dac}}{dt} = i_{leak}$$

in order to compensate for the leakage current ileak. Compensation of these leakage would thus require to apply a slope $$\frac{dV_{dac}}{dt} = \frac{i_{leak}}{C_{dac}}$$

at the output of the digital-to-analog converter 15. And this slope would anyway finish by saturate when the full scale of the digital-to-analog converter 15 would be reached.

A way to solve this problem would be to create a DC path to the virtual ground 169 such that the total charge converges to a suitable value in order to maintain the voltage value of the feedback signal in the range of the digital-to-analog converter 15 with Vvirt=Vvirt0 and Vamp=Vamp0. The charge brought to the virtual ground 169 would however preferably be controlled in some way by the feedback path, thus proportional to the digital output signal, otherwise a supplementary error term in the relation between input and output would appear. A way to do it would for example be to replace the capacitor 162 by a switched capacitor branch 165, as illustrated in FIG. 5.

Figure 5:
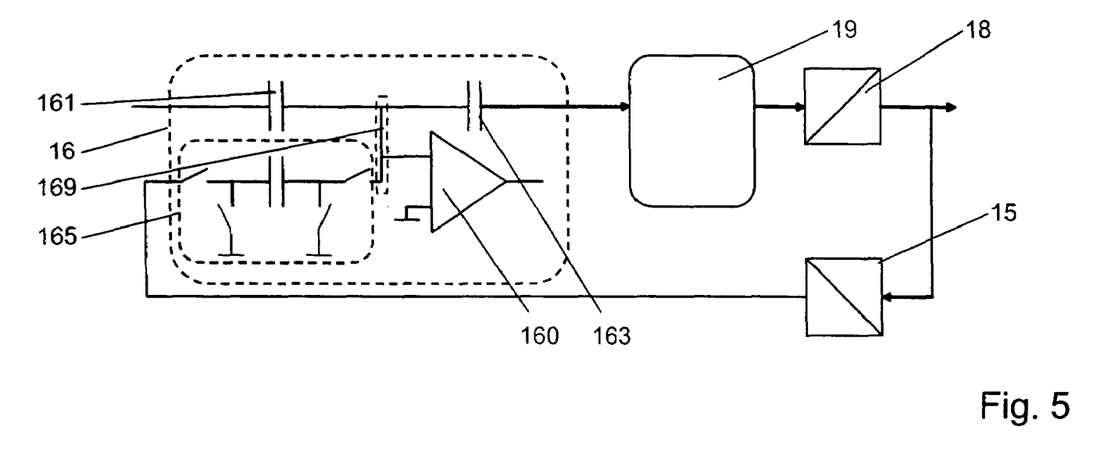
FIG. 5 illustrates a variant embodiment of the electronic circuit of FIG. 4, already discussed

With reference to FIG. 5, it is assumed that the gain of the feedback loop is strong enough for maintaining the voltage value Vvirt at the virtual ground 169 around Vvirt0 and the voltage value Vamp of the error signal around Vamp0. In this case, the current flowing through the capacitance value Cin of the input coupling capacitor 161 is equal to $$C_{in} \cdot \frac{dV_{in}}{dt},$$

while the current through the switched capacitor branch 165 is equal to $$C_{dac} \cdot V_{dac} \cdot f_s, \quad \text{with } f_s = \frac{1}{T_s}$$

being the frequency of the control signals controlling the switching within the switched capacitor branch. fs is preferably also the sampling rate, Ts corresponding thus the sampling period. As the current through the feedback switched capacitor branch 165 should compensate the current through the input coupling capacitor 161, one should have:

$$C_{in} \frac{dV_{in}}{dt} = C_{dac} \cdot V_{dac} \cdot f_s$$

or $$V_{dac} = \frac{C_{in}}{C_{dac}} \cdot \frac{1}{f_s} \frac{dV_{in}}{dt} = \frac{C_{in}}{C_{dac}} \cdot T_s \frac{dV_{in}}{dt}.$$

Figure 6:
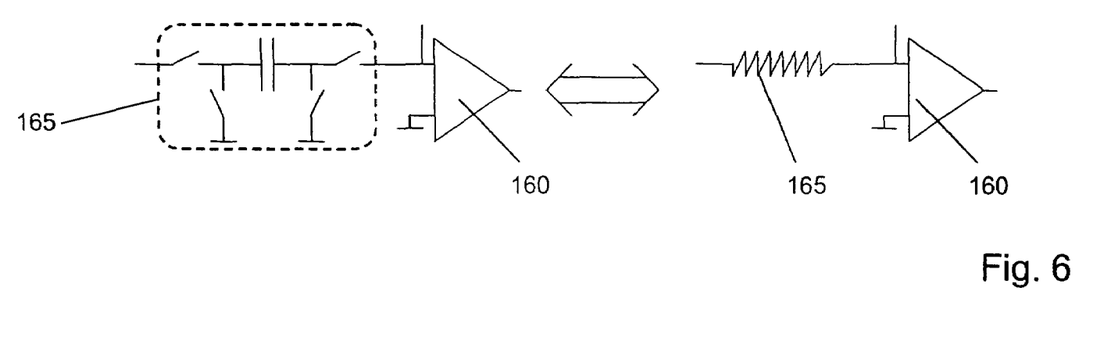
FIG. 6 illustrates the equivalence between a switched capacitor and a resistance.

Assuming that the voltage value Vdac of the feedback signal is proportional to the output signal of the conversion circuit, the voltage value Vdac, and thus the output signal of the conversion circuit, are, according to the equation above, proportional not to the voltage value Vin of the input signal but to its derivative. Indeed, the switched capacitor branch 165 of FIG. 5 can be replaced by an equivalent resistor 166 with $$R_{dac} = \frac{1}{C_{dac} \cdot f_s}$$

as illustrated in FIG. 6.

Figure 7:
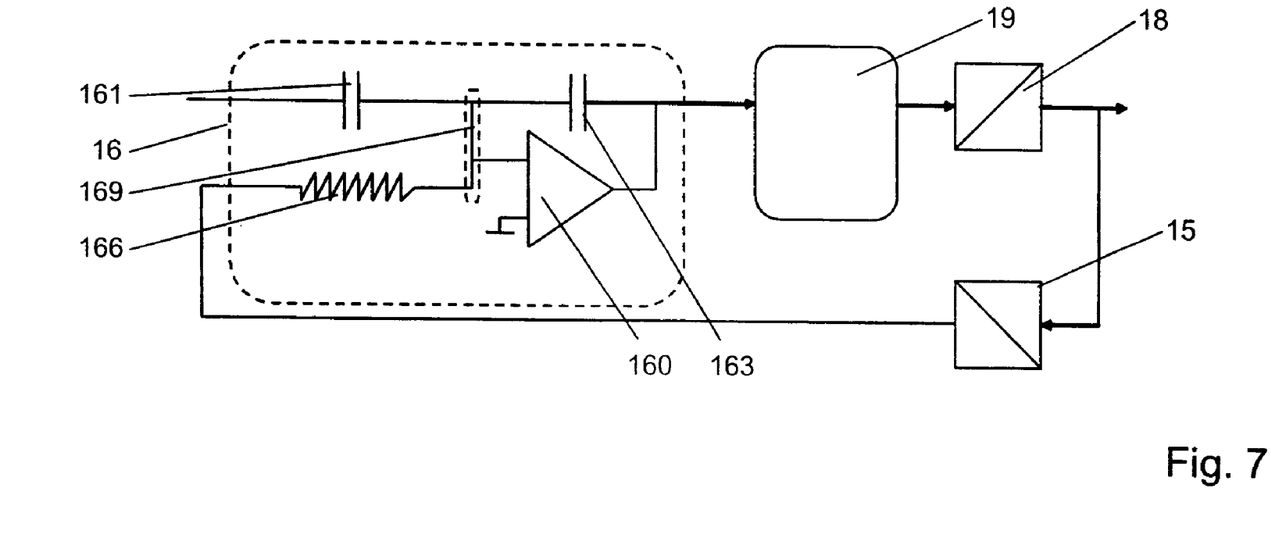
FIG. 7 is an equivalent schematic representation of the electronic circuit of FIG. 5.

FIG. 5 is then functionally equivalent to FIG. 7, from which the one skilled in the art will recognize why the output signal and the feedback signal are representative of the derivative of the input signal. According to the example of FIG. 7, the digital output of the conversion circuit must thus be digitally integrated and high pass filtered in order to reconstruct the input signal. The digital high pass filtering is preferably done simultaneously with the digital integration or before, in order to avoid digital overflow.

If the conversion circuit of FIG. 5 with a switched capacitor 165 in the feedback path solves the problem of the undefined charge of the virtual ground 169, replacing the unswitched capacitor 162 in the conversion circuit of FIG. 4 by the switched capacitor 165 brings several drawbacks.

A drawback of the conversion circuit of FIG. 5 is that each time the charge on the switched capacitor 165 is sampled by opening one of the switches in the electrical path, a noise voltage of mean square value k·T/Cdac is stored on the switched capacitor 165 and superposed to the active feedback signal. As the switched capacitor 165 is preferably sampled two times per sampling cycle, once during a precharge phase and once during an integration phase, a random noise charge of mean square value 2·k·T·Cdac is brought at each sampling cycle to the virtual ground 169. This random noise is equivalent to the thermal noise of the equivalent resistor 166 of FIG. 7. As explained above, this noise can be considered as an input voltage and implies that very large impedance value, in the order of 1 gigohm, should be chosen for the equivalent resistor 166 in order to be kept within acceptable limits. Assuming for example that the capacitance Cin of the input coupling capacitor 161 is 50 pF, it corresponds, for a signal at a frequency of 10 kHz, to an impedance of $$Z_{in} = \frac{1}{(2 \cdot \pi \cdot 10 \text{ kHz} \cdot 50 \text{ pF})},$$

which is approximately equal to 300 kohms. The voltage value of the feedback signal required to balance the input signal would thus be $$Vdac = \left(\frac{Rdac}{Zin}\right) \cdot Vin.$$

As, for the reasons mentioned above, the equivalent resistance Rdac of the switched capacitor 165 must be very high, the range of the digital-to-analog converter 15 should be several orders of magnitudes higher than the input voltage, which is not realistic. Moreover, the noise of the preamplifier 16 would also be integrated at each clock cycle.

Further drawbacks of the conversion circuit of FIG. 5 are for example the fact that the offset voltage of the preamplifier 16 is integrated at each clock cycle, and the charge which the switches of the switched capacitor 165 inject over the feedback signal.

BRIEF SUMMARY OF THE INVENTION

An aim of the present invention is thus to propose a circuit for the analog-to-digital conversion of an analog input signal which doesn't have the drawbacks of the conversion circuits described above.

Another aim of the present invention is to propose a circuit for the analog-to-digital conversion of an analog input signal which can be realized as an integrated circuit.

These aims are achieved with the electronic circuit of independent claim 1, variant embodiments being given by the dependent claims.

These aims are achieved in particular by an electronic circuit for the analog-to-digital conversion of the alternative current (AC) component of an analog input signal, comprising:

a coupling device comprising an input and an output, the coupling device delivering at its output an analog AC signal when the analog input signal is applied to the input, an analog-to-digital converter for converting the analog AC signal into a digital output signal, a feedback loop comprising a digital-to-analog converter for converting the digital output into an analog feedback signal, the feedback loop being coupled to the coupling device, wherein the feedback loop comprises a first feedback path comprising a switched capacitor.

In a preferred embodiment, the electronic circuit of the invention comprises a feedback loop comprising:

a first feedback path comprising an switched capacitor for injecting packets of electrical charges on the virtual ground at startup, until the digital-to-analog converter's output on the first feedback path is biased around the middle of its range, a second feedback path comprising a switched capacitor for compensating the variations of the input signal in phase opposition, with $Vdac = Cin \cdot Vin / Cdac.$ After startup, the switched capacitor is preferably activated at an extremely low frequency, as it should remain active only to compensate the leakage. Preferably, the switched capacitor is used in order to avoid that the voltage to be applied on the unswitched capacitor exceeds the range of the digital-to-analog converter.

BRIEF DESCRIPTION OF THE DRAWINGS

The present invention will be better understood with the help of the description of a preferred embodiment, illustrated by the FIGS. 1 to 11, where.

already discussed

already discussed

DETAILED DESCRIPTION OF THE INVENTION

Figure 8:
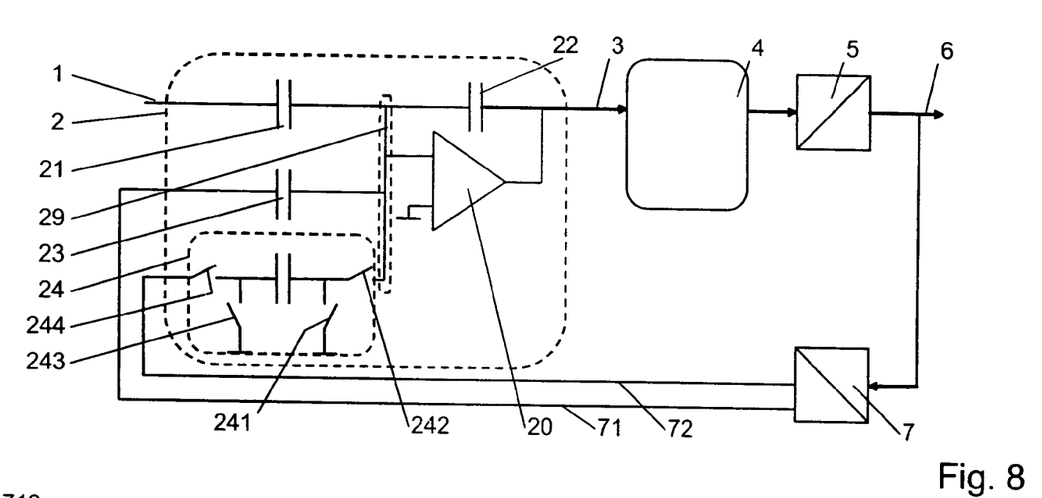
FIG. 8 illustrates a preferred embodiment of an electronic circuit according to the present invention.

FIG. 8 illustrates a preferred embodiment of the electronic circuit of the invention for the analog-to-digital conversion of the alternative current (AC) component of an analog input signal.

The conversion circuit comprises an input 1 for the input of an analog input signal. The input 1 is preferably directly connected to a preamplifier 2. The output 3 of the preamplifier is connected to an optional analog processing block 4 which can for example comprise an integrator, a filter, an amplifier, or any other analog signal processing device for performing a desired processing of the signal coming out of the preamplifier 2. The output of the analog processing block 4 is connected to an analog-to-digital converter 5 whose output 6 delivers the desired digital output signal of the electronic circuit.

The electronic circuit of the invention further comprises a feedback loop between the output 6 of the analog-to-digital converter 5 to the preamplifier 2. The feedback loop comprises a digital-to-analog converter 7 for converting the circuit's digital output signal back into an analog signal. The analog feedback signal is then directed over two electrically conducting feedback paths 71, 72 which close in the preamplifier 2.

Preferably, the preamplifier 2 has high-pass characteristics, in order to filter out the DC component of the analog signal applied at its input 1. The preamplifier 2 comprises an input coupling capacitor 21 which is connected on one side to the input 1 and on the other side to the input of an amplifier 20. The feedback paths 71 and 72 are preferably also coupled to the input of the amplifier 20, each over a coupling capacitor 23, 24 respectively. According to the invention, a first feedback path 72 is coupled to the input of the amplifier 20 over a switched capacitor 24, while a second feedback path 71 is coupled over an unswitched capacitor 23. The output of the amplifier 20 is further coupled back to its input over a feedback capacitor 22. The input of amplifier 2 thus defines a virtual ground 29.

The input 1 is AC-coupled to the virtual ground 29. When an analog input signal is applied to the input 1 of the electronic circuit of the invention, charges are thus injected on the virtual ground 29 by the useful signal of the input signal, i.e. by at least a part of its AC component, over the input coupling capacitor 21. Similarly, charges depending on the analog feedback signal are injected on the virtual ground 29 over the unswitched capacitor 23 and the switched capacitor 24 by the feedback signal.

In a preferred embodiment, the feedback signal is proportional to the digital output signal which preferably is proportional to the useful signal of the input signal. By choosing the appropriate polarity for the feedback signal, the charges injected by it are subtracted from the charges injected by the useful signal. The analog signal which will be amplified by the amplifier 20 is thus an error signal depending on the difference between the useful signal and an analog feedback signal corresponding to the digital output. The amplitude of the error signal being preferably small, the required dynamic range for the analog-to-digital converter 5 can be kept relatively small, whatever the amplitude of the useful signal is.

According to the invention, a charge which is preferably dependent on the digital output of the electronic circuit, is thus injected on the virtual ground 29 of the preamplifier 2 through two different feedback paths 71, 72 comprising different capacitors 23, 24, the first feedback path 72 comprising a switched capacitor 24, while the second feedback path 71 comprises an unswitched capacitor 23.

Preferably, the charges injected by the useful signal of the input signal are mainly compensated by the charges injected over the unswitched capacitor 23 due to the voltage applied to the second feedback path 71. The switched capacitor 24 is preferably used mainly to keep the feedback path 71, in particular the left side of capacitor 23, within a well defined voltage range, for instance between ground and supply voltages, while the virtual ground 29 also remains close to its nominal value. The frequency at which the switched capacitor 24 is switched by activating the corresponding switches is preferably minimized in order to minimize thermal noise.

The charge injected through the unswitched capacitor 23 at time k Qunsw(k) is equal to $$Q\text{unsw}(k) = C\text{unsw} \cdot [V\text{unsw}(k) - V\text{unsw}(k-1)]$$

with Vunsw(k) being the voltage applied at time k on the electrode of the unswitched capacitor 23 which is connected to the second feedback path 71 and Cunsw being the capacitance value of the unswitched capacitor 23.

Similarly, the charge injected through the switched capacitor 24 at time k, Qsw(k), is given by:

$$Q\text{sw}(k) = C\text{sw} \cdot [V\text{sw,int}(k) - V\text{sw,prech}(k)]$$

with Csw being the capacitance value of the switched capacitor 24, while Vsw,int(k) is the voltage on the switched capacitor 24 during the integration phase at time k, i.e. when the switch 242 connecting the switched capacitor to the virtual ground 29 is closed, and Vsw,prech(k) is the voltage at which the switched capacitor 24 was precharged before the integration phase, i.e. the voltage on the switched capacitor 24 last time that switch 241 was opened.

The sum of these charges Qunsw and Qsw are preferably proportional to the digital output of the electronic circuit in order to compensate, at least in average, the charge injected by the useful signal on the virtual ground 29 through the input coupling capacitor 21, and the leakages:

$$Q\text{unsw}(k) + Q\text{sw}(k) \propto \text{digital\_output}$$

Preferably, the charges injected through the unswitched capacitor 23 and through the switched capacitor 24 are thus matched, which implies that:

the capacitors 23 and 24 are matched, the voltages or at least the voltage steps applied to the feedback paths 71 and 72 are related by matching, for instance by deriving them from a same voltage with a well defined ratio.

In a preferred embodiment, the digital-to-analog converter 7 in the feedback loop thus provides two output levels for the signals applied to the first and second feedback paths 72, 71 which are chosen such that the total charge injected through the capacitors 23 and 24 is directly proportional to the digital output. As this total charge injected by the feedback signal preferably compensates for the charge injected through the input coupling capacitor 21, the digital output must be proportional to the derivative of the voltage of the input signal. High pass filtering and integrating the digital output from the circuit of the invention would then give back a digital signal proportional to the input signal in the useful bandwidth, i.e. to the useful signal.

Various strategies are possible and can be combined for operating the conversion circuit according to a preferred embodiment of the invention illustrated in FIG. 8 and injecting the required charges over the feedback paths 71, 72 through the capacitors 23 and 24.

In order to limit the switching rate of the switching capacitor 24, it is preferable to inject a maximum amount of charge through it each time it switches, thus to apply a maximal voltage step on the feedback path 72 between precharge and integration phase, and to inject the charge always in the same direction in order to compensate for the leakages. The allowed voltage steps must however be well defined fractions of a given reference voltage which can be delivered by the digital-to-analog converter, corresponding for example to its supply voltage. The maximum voltage step to apply to the switched capacitor 24 is thus preferably equal to the reference voltage itself, while voltage steps corresponding to smaller fractions of the voltage reference are applied to the unswitched capacitor 23 in order to obtain a finer tracking of the input signal by the second feedback path 71.

Figure 9:
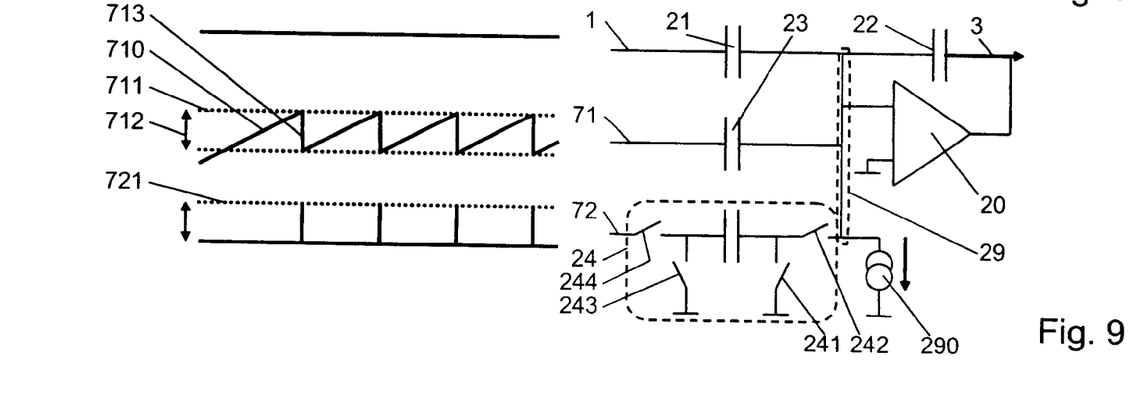
FIG. 9 illustrates the compensation of a leakage current on virtual ground by sawtooth signal and charge pulses.

FIG. 9 illustrates an example of feedback signals applied to the second feedback path 71 and to the first feedback path 72. The current source 290 is a schematic representation of the leakage current leaking from the virtual ground 29. Assuming there is no active signal on the input 1, the leakage current is compensated by a rising voltage slope 710 on the second feedback path 71, such that $$\frac{dVunsw}{dt} = \frac{Ileak}{Cunsw},$$

where Ileak is the leakage current.

However, when the voltage applied to the second feedback loop reaches a maximum 711, it must be brought back within the range of the digital-to-analog converter by reducing its voltage for example by a voltage difference 712. The negative voltage step 713 on the second feedback path 71 generates a negative charge $$-\Delta V \cdot Cunsw$$

where $\Delta V$ is the value of voltage difference 712, which is injected on the virtual ground 29. This negative charge is compensated by injecting a charge through the switched capacitor 24. The injected charge is for example equal to $$Csw \cdot Vref,$$

where Vref is the value of the reference voltage 721. This charge is injected by opening switch 242 and closing switch 241 during the precharge phase and by opening switch 241 and closing switch 242 during the integration phase. The amplitude of the negative step 713 that can be applied to the second feedback path 71, for example by reducing the input digital signal of the corresponding digital-to-analog converter in order to come back to the middle of its range, is given by $$\Delta V = \frac{Csw \cdot Vref}{Cunsw}.$$

If the leakage current is very low, the refresh frequency, i.e. the frequency at which the charge on the virtual ground 29 must be refreshed by activating the switched capacitor 24, will be very low, and so will be the equivalent thermal noise.

According to a variant operating strategy, the switched capacitor 24 is activated at a periodic rate, instead of being activated only when required in order to avoid the voltage on the second feedback path to rise over the maximum 711. An advantage of this variant strategy is that the error due to the integration of the offset voltage of the preamplifier would be a systematic error, that could be more easily eliminated, namely digitally by high pass filtering. A drawback is that it would be noisier, the capacitor 24 being switched at a frequency higher than required for leakage compensation.

According to a variant embodiment of the invention, the switched capacitor 24 comprises several switched capacitors which can for example be activated independently from each other depending on the required amount of charge to be injected on virtual ground 29.

In another variant embodiment, the input 1 is AC coupled to the virtual ground 29 over another coupling device, such as for example an array of capacitors, a high pass filter, a band pass filter, etc.

In still another variant embodiment, the electronic circuit of the invention doesn't comprise any preamplifier 2. The virtual ground 29 is then for example directly connected to the input of the analog processing block 4, or to the analog-to-digital converter 5.

Combinations of the above mentioned embodiments are also possible within the frame of the invention.

Advantages of the electronic circuit of the invention are:

The output of the preamplifier 2 is representative of the difference between the analog input signal and the digital output signal converted back into analog, thus of the quantization error. Consequently, the better the approximation of the input signal by the output signal is, the smaller the output voltage of the preamplifier 2 will be. Or, if the output voltage range of preamplifier 2 is limited, for instance by the supply voltage, the better the approximation of the input signal by the output signal is, the higher the gain that can be achieved by the preamplifier 2 without saturating. The advantage is that, by achieving a high gain already in the preamplifier 2, the negative impacts of noise sources further in the forward path of the electronic circuit on the accuracy of the output signal are reduced.

The conversion range automatically focuses around the DC level of the input signal, by pumping charges through the switched capacitor 24 until the charge variations due to the input signal can be compensated by the feedback signal applied to the unswitched capacitor 23.

The normal range of the analog-to-digital converter 5 is then the one which can be compensated by the unswitched capacitor only, and is given by:

$$\text{normal range} = \frac{Cunsw}{Cin} \cdot dac\_range,$$

where dac_range is the range of the digital-to-analog converter 7. When the input signal is within the normal range of the analog-to-digital converter 5, it can be compensated by the charges injected through the unswitched capacitor 23, while the switched capacitor 24 is used at a very low rate, just to compensate for the leakage current. Hence, thermal noise level is minimized for small signals The converter is however also able to follow large amplitudes signals thanks to the switched capacitor 24. Indeed, if a large signal exceeding the normal range defined above is applied, it will be compensated by the voltage applied to the unswitched capacitor 23 until this voltage reaches its maximum. The switched capacitor 24 will then be activated in order to inject charges and maintain the voltage applied to the unswitched capacitor 23 within the range of the digital-to-analog converter 7. Notice that large signals will be affected by more thermal noise, due to the activation of the switched capacitor 24. The maximum signal range that can be admitted by the converter 7 is determined by the maximum current Ifb that can be injected by the switched capacitor 24:

$$Ifb = Csw \cdot Vmax \cdot fs.$$

With Vmax being the voltage applied on the switched capacitor 24 between precharge and integration phase. This current should compensate the current due to the charges injected by the input signal through the input coupling capacitor 21. Assuming that the input signal is a sinusoidal signal of amplitude Vinpeak and frequency f, the input current In due to the charges injected by the input signal is given by:

$$In = Cin \frac{dVin}{dt}$$
$$= Cin \frac{d(Vinpeak \cdot \sin(2 \cdot \pi \cdot f \cdot t))}{dt}$$
$$= Cin \cdot Vinpeak \cdot 2 \cdot \pi \cdot f \cdot \cos(2 \cdot \pi \cdot f \cdot t)$$

As In must remain smaller than Ifb, the maximum signal amplitude that can be compensated by the switched capacitor 24 is given by:

$$Vinpeak < \frac{Csw \cdot fs}{Cin \cdot 2 \cdot \pi \cdot f} \cdot Vref.$$

The noise level is however higher because the switched capacitor 24 needs to be activated up to the maximum rate according to the signal amplitude and the capacitance Csw of the switched capacitor 24 and the voltage Vmax. However this is generally less a problem, for audio and for infrared detection namely, in case of large signals.

According to the inequality above, arbitrary large signals can be compensated in the feedback path, provided that enough switched capacitors are available in the first feedback path. In a variant embodiment of the invention, the switched capacitors used for compensation of large signals and those used for compensation of the leakage are different ones, and they are preferably operated according to different algorithms or strategies.

In a variant embodiment, the range of the electronic circuit of the invention is extended by reducing the gain by a given factor in the analog part of the circuit in order to avoid saturation, and multiplying by the same factor in the digital part in order to maintain the overall gain constant. This is called gain switching. The gain reduction in the analog part of the circuit is for example performed by increasing the capacitance of the feedback capacitor 22 of the preamplifier 2, for example by putting several identical capacitors in parallel and switching them together if necessary.

In a variant embodiment of the invention, the roles of the switched capacitor 24 and of the unswitched capacitor 23 are both achieved by a single switched capacitor or by an array of switched capacitor. According to this embodiment, the electronic circuit of the invention comprises for example one feedback path comprising a switched capacitor.

The switched capacitor then preferably remains unswitched most of the time, thus assuming the function of the unswitched capacitor 23 as described above. The switched capacitor is only switched when required to keep the feedback path within a well defined voltage range by creating a temporary connection between the virtual ground and the electrical ground. The switched capacitor is thus for example switched at the circuit's start-up. Once the feedback path reached the desired voltage range, it remains unswitched in order to avoid the noise which would be generated by its switching.

According to a variant embodiment, the single switched capacitor or array of switched capacitors is switched with a relatively high frequency at the circuit's start-up. Once the feedback path reached the desired voltage range, it is switched at a significantly lower frequency which is preferably sufficient to keep the feedback path within the desired voltage range while minimizing the switching capacitor's switching noise.

The invention claim is:

1. An electronic circuit for the analog-to-digital conversion of the alternative current (AC) component of an analog input signal, comprising:
   a coupling device comprising an input and an output, said coupling device delivering at its output an analog AC signal when said analog input signal is applied to said input,
   an analog-to-digital converter for converting said analog AC signal into a digital output signal,
   a feedback loop comprising a digital-to-analog converter for converting said digital output into an analog feedback signal, said feedback loop being coupled to said coupling device,
   wherein said feedback loop comprises a first feedback path comprising a switched capacitor and a second feedback path comprising an unswitched capacitor.

2. The electronic circuit of claim 1, further comprising regulating means for activating said switched capacitor at a first frequency at the electronic circuit's start-up and at a second frequency after said start-up, said second frequency being lower as said first frequency.

3. The electronic circuit of claim 1, the output of said coupling device being a virtual ground having no galvanic connection to the electrical ground.

4. The electronic circuit of claim 1, said feedback loop being coupled to the output of said coupling device for combining said feedback signal with said analog AC signal.

5. The electronic circuit of claim 1, said first feedback path and said second feedback path being connected between said digital-to-analog converter and said coupling device.

6. The electronic circuit of claim 1, wherein said switched capacitor and said unswitched capacitor are matched.

7. The electronic circuit of claim 1, said coupling device comprising an input coupling capacitor.

8. The electronic circuit of claim 7, said coupling device comprising an array of input coupling capacitors.

9. The electronic circuit of claim 1, said feedback loop being coupled to the output of said coupling device such that said analog feedback signal is subtracted from said analog AC signal.

10. The electronic circuit of claim 1, said first feedback path comprising a plurality of switched capacitor.

11. The electronic circuit of claim 1, further comprising an amplifier connected to said output of said coupling device for amplifying said analog AC signal.

12. The electronic circuit of claim 1, realized as an integrated circuit.

13. The electronic circuit of claim 1, comprising means for switching said switched capacitor at a frequency chosen in order to optimize the thermal noise of said switched capacitor.

14. An electronic circuit for the analog-to-digital conversion of the alternative current (AC) component of an analog input signal, comprising:
   a coupling device comprising an input and an output, said coupling device delivering at its output an analog AC signal when said analog input signal is applied to said input,
   an analog-to-digital convener for converting said analog AC signal into a digital output signal,
   a feedback loop comprising a digital-to-analog converter for converting said digital output into an analog feedback signal, said feedback loop being coupled to said coupling device, wherein said feedback loop comprises a first feedback path comprising a switched capacitor, the electronic circuit further comprising regulating means for activating said switched capacitor at a first frequency at the electronic circuit's start-up and at a second frequency after said start-up, said second frequency being lower as said first frequency.

15. The electronic circuit of claim 14, said feedback loop being coupled to the output of said coupling device such that said analog feedback signal is subtracted from said analog AC signal.

16. An electronic circuit for the analog-to-digital conversion of the alternative current (AC) component of an analog input signal, comprising:

a coupling device comprising an input and an output, said coupling device delivering at its output an analog AC signal when said analog input signal is applied to said input, an analog-to-digital converter for converting said analog AC signal into a digital output signal, a feedback loop comprising a digital-to-analog converter for converting said digital output into an analog feedback signal, said feedback loop being coupled to said coupling device, wherein said feedback loop comprises a first feedback path comprising a switched capacitor, and a second feedback path comprising an unswitched capacitor, the electronic circuit further comprising regulating means for activating said switched capacitor at a first frequency at the electronic circuit's start-up and at a second frequency after said start-up, said second frequency being lower as said first frequency.

17. The electronic circuit of claim 16, said feedback loop being coupled to the output of said coupling device such that said analog feedback signal is subtracted from said analog AC signal.

* * * * *